(12) United States Patent
Kojima

(10) Patent No.: US 8,344,395 B2
(45) Date of Patent: Jan. 1, 2013

(54) LIGHT-EMITTING DIODE AND MANUFACTURING METHOD THEREOF

(75) Inventor: Kensuke Kojima, Kanagawa (JP)

(73) Assignee: Sony Corporation, Tokyo (JP)

( * ) Notice: Subject to any disclaimer, the term of this patent is extended or adjusted under 35 U.S.C. 154(b) by 215 days.

(21) Appl. No.: 12/775,674

(22) Filed: May 7, 2010

(65) Prior Publication Data

US 2010/0301380 A1    Dec. 2, 2010

(30) Foreign Application Priority Data

May 29, 2009 (JP) ................ P2009-129766

(51) Int. Cl.
*H01L 33/00* (2010.01)

(52) U.S. Cl. ..... 257/88; 257/200; 257/201; 257/E21.17; 257/E21.053; 257/E21.126; 257/E21.127; 257/E21.138; 257/E21.229; 257/E21.352; 257/E21.259

(58) Field of Classification Search ............ 257/88, 257/15, 79, 199, 200, 201, 290, E21.17, E21.053, 257/E21.126, E21.127, E21.138, E21.229, 257/E21.231, E21.259, E21.352
See application file for complete search history.

(56) References Cited

U.S. PATENT DOCUMENTS

| | | | | |
|---|---|---|---|---|
| 6,130,147 A * | 10/2000 | Major et al. | ............ | 438/604 |
| 6,555,403 B1 * | 4/2003 | Domen et al. | ............ | 438/22 |
| 6,998,700 B2 * | 2/2006 | Toba et al. | ............ | 257/627 |
| 7,256,478 B2 * | 8/2007 | Toba et al. | ............ | 257/627 |
| 7,508,010 B2 * | 3/2009 | Udagawa | ............ | 257/103 |
| 2002/0117677 A1 * | 8/2002 | Okuyama et al. | ............ | 257/94 |

FOREIGN PATENT DOCUMENTS

| JP | 2005-150673 | 6/2005 |
|---|---|---|
| WO | 02-07231 A1 | 1/2002 |

OTHER PUBLICATIONS

T. Kobayashi, H. Kojima, R.S. Doel, N. Buchan, W. Neuberger, A. Jakubowicz, and P. Roentgen, Journal of Physics and Chemistry of Solids, vol. 56, Issues 3-4, Mar.-Apr. 1995, pp. 311-317.

* cited by examiner

*Primary Examiner* — David Nhu
(74) *Attorney, Agent, or Firm* — K&L Gates LLP

(57) ABSTRACT

A method for manufacturing a light-emitting diode includes the steps of: growing a light-emitting diode structure-forming semiconductor layer of a compound semiconductor having a zincblende crystal structure on a first substrate formed of a compound semiconductor having a zincblende crystal structure and that has a principal surface tilted in a [110] direction with respect to a (001) plane; bonding the first substrate to a second substrate on the side of the semiconductor layer; removing the first substrate so as to expose the semiconductor layer; forming an etching mask on the exposed surface of the semiconductor layer in a rectangular planar shape so that a longer side extends in a [110] or [−1-10] direction, and that a shorter side extends in a [−110] or [1-10] direction; and patterning the semiconductor layer by wet etching using the etching mask.

6 Claims, 22 Drawing Sheets

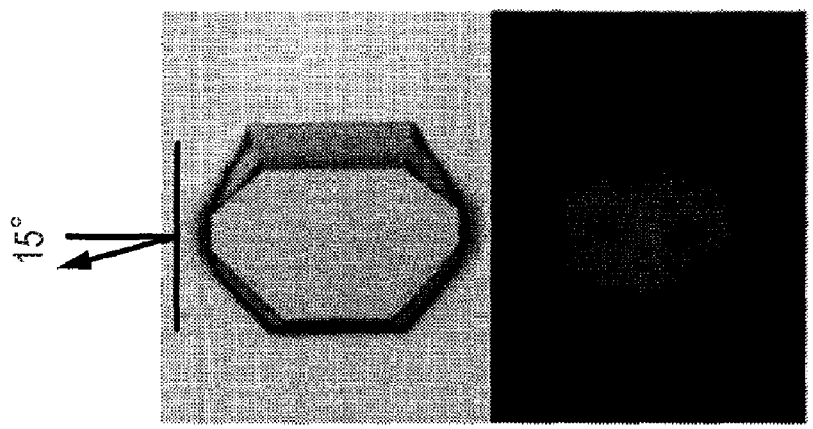
FIG.6B
FIG.6C
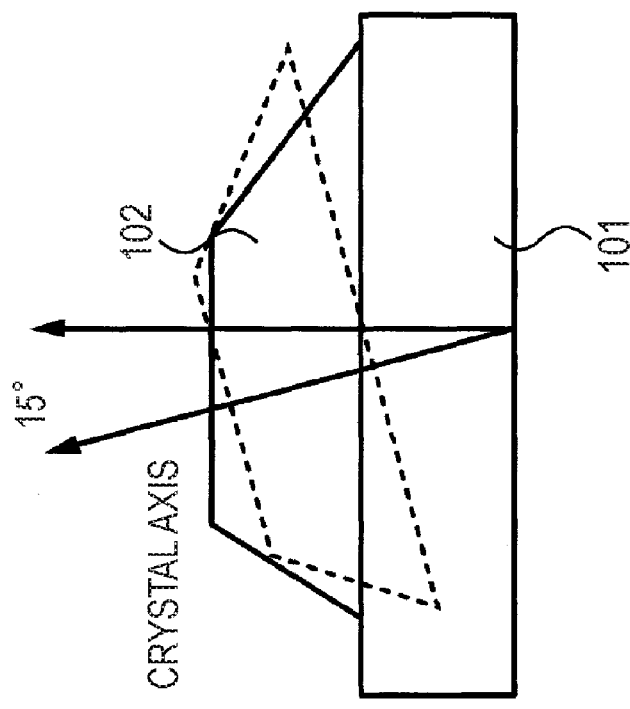
FIG.6A

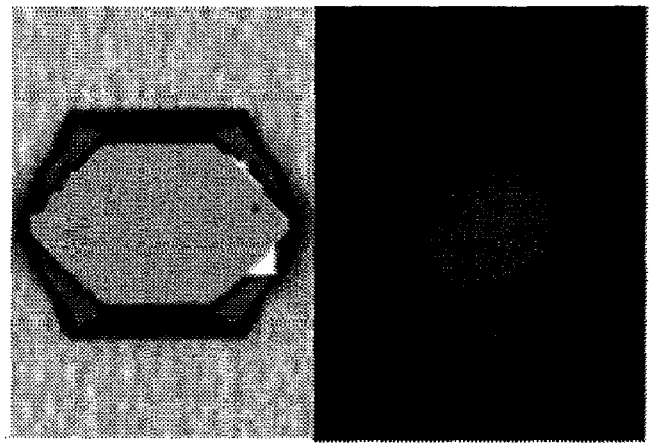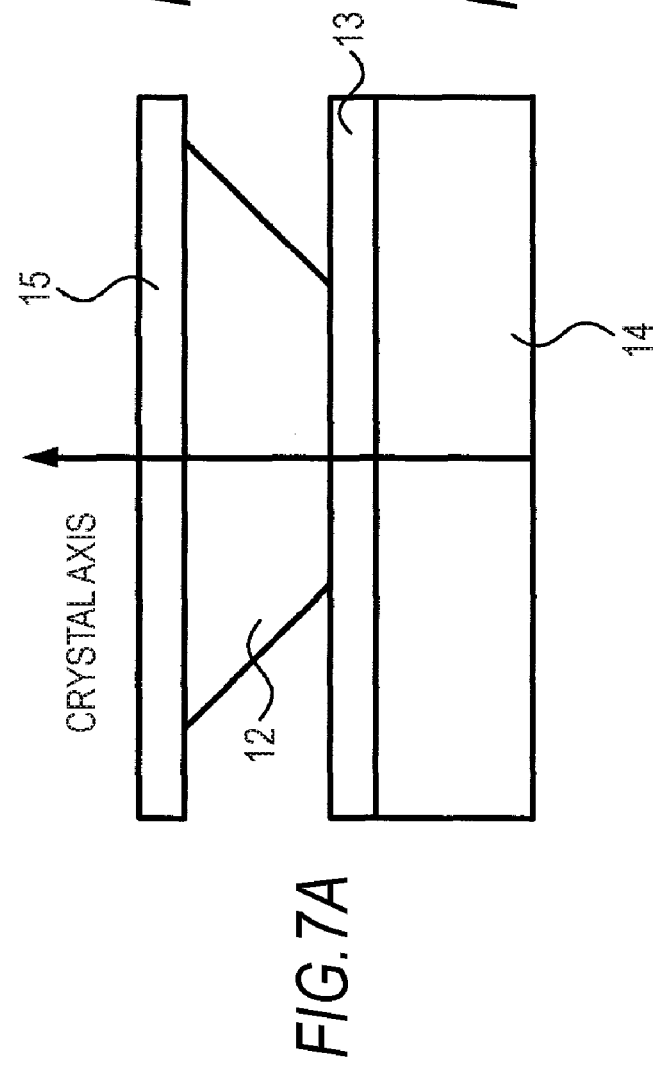
FIG.7B  FIG.7C
FIG.7A

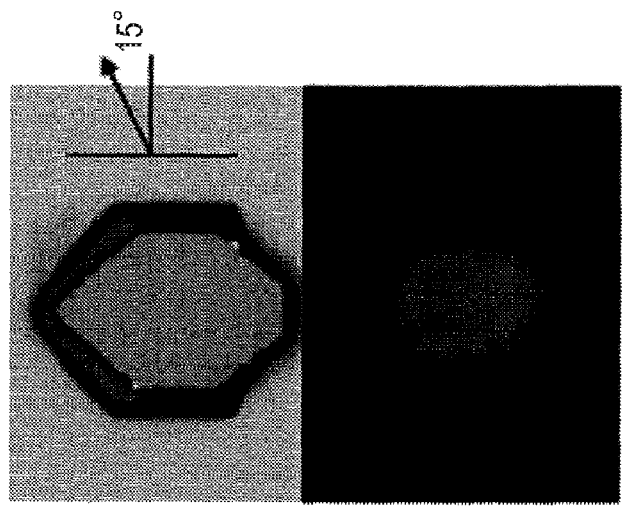
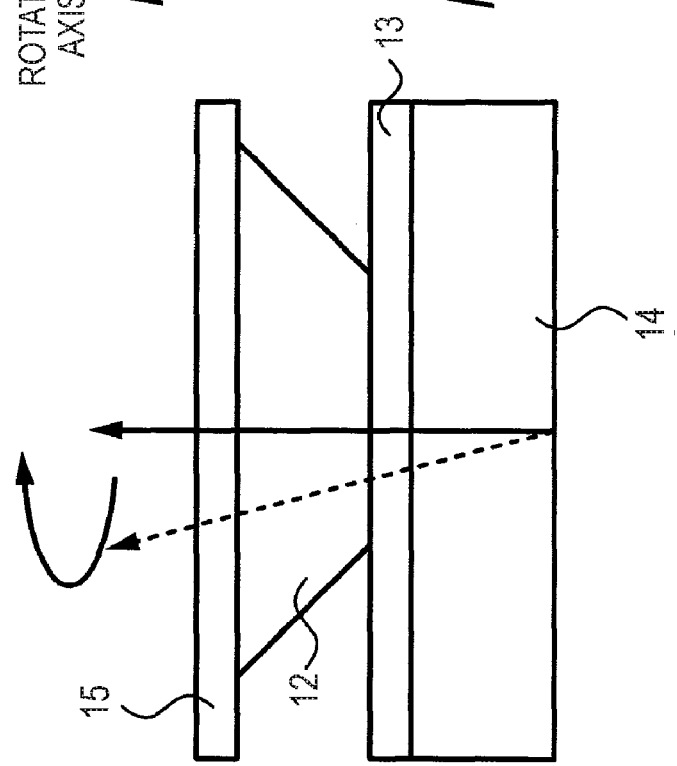
FIG.8A
FIG.8B  ROTATE CRYSTAL AXIS BY 90°
FIG.8C

PRIOR ART

PRIOR ART

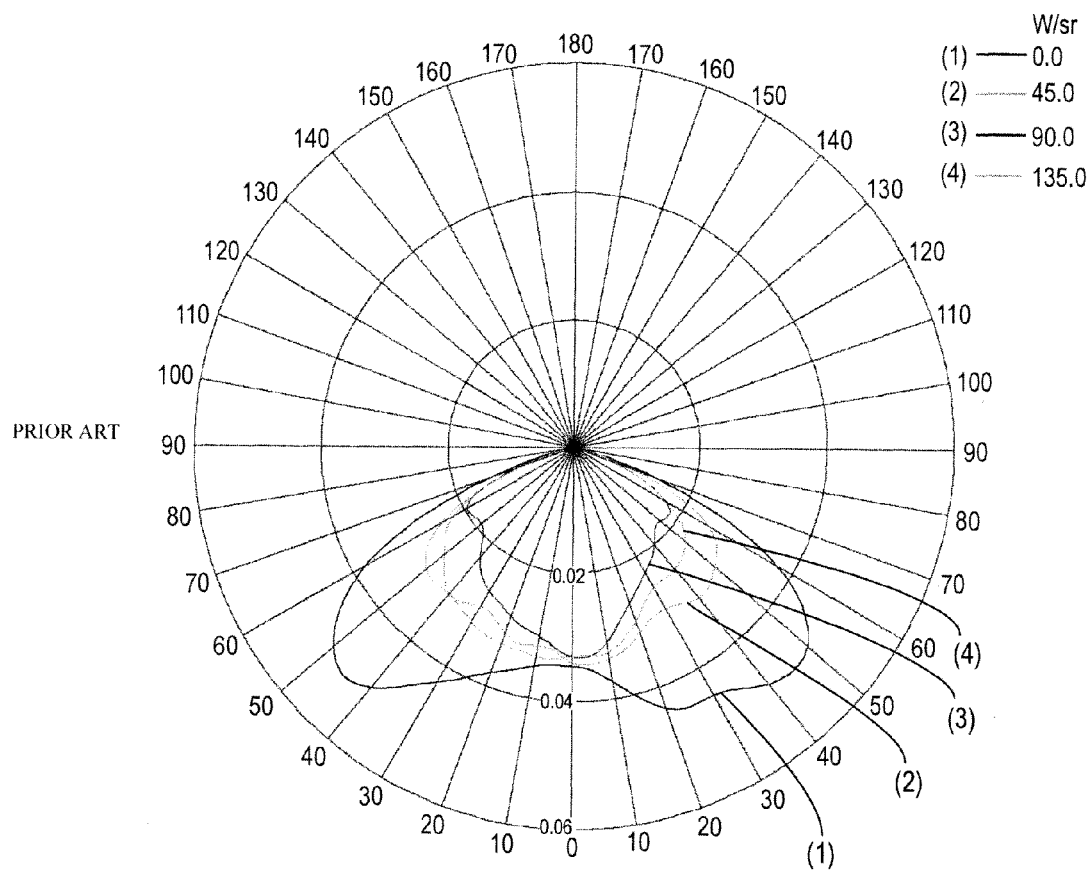

PRIOR ART

LIGHT-EMITTING DIODE AND MANUFACTURING METHOD THEREOF

CROSS REFERENCES TO RELATED APPLICATIONS

The present application claims priority to Japanese Priority Patent Application JP 2009-129766 filed in the Japan Patent Office on May 29, 2009, the entire content of which is hereby incorporated by reference.

BACKGROUND

The present application relates to light-emitting diodes and manufacturing methods thereof. The present application is particularly suitable for application in microscopic light-emitting diodes.

There have been proposed microscopic light-emitting diodes that measure about several ten micrometers (see, for example, WO 2002/07231, and JP-A-2005-150673). An example of such light-emitting diodes is a light-emitting diode that uses a compound semiconductor, such as an AlGaInP semiconductor, having a zincblende crystal structure.

An example of a manufacturing method of such a light-emitting diode is described below with reference to FIG. 14A to 14C. According to this manufacturing method, as illustrated in FIG. 14A, a semiconductor layer 102 to form a light-emitting diode structure is first grown on a GaAs substrate 101 whose principal surface lies on the (001) plane. The semiconductor layer 102 is of a compound semiconductor having a zincblende crystal structure. The semiconductor layer 102 includes an active layer 102a, and additional layers such as an n-type clad layer and a p-type clad layer. Then, as illustrated in FIG. 14B, a resist pattern 103 having a rectangular planar shape is formed on the semiconductor layer 102. The planar shape of the resist pattern 103 is shown in FIG. 15. As illustrated in FIG. 15, the resist pattern 103 has a longer side that extends in the [−110] or [1-10] direction of the semiconductor layer 102, and a shorter side that extends in the [110] or [−1-10] direction of the semiconductor layer 102. The semiconductor layer 102 is then patterned by wet etching using the resist pattern 103. In the wet etching of the semiconductor layer 102 having a zincblende crystal structure, the semiconductor layer 102 is etched in a shape according to the plane direction, because the etching rate varies depending on the plane direction. Specifically, the etching rate for the {111} planes is about 1/100 of that for the {110} planes. Thus, the etching state of the semiconductor layer 102 on the longer side of the resist pattern 103 extending in the [−110] or [1-10] direction is specified by the etching rate of the {111} planes, and as such the semiconductor layer 102 is etched to have a cross sectional shape of a forward mesa configuration. The etching therefore proceeds to form {111} planes (more specifically, (111) and (−1-11) planes) in portions of the semiconductor layer 102 on the longer side of the resist pattern 103. At the completion of the etching, as illustrated in FIG. 14C, the side faces of the semiconductor layer 102 that extend in the [−110] or [1-10] direction are tilted on planes that lie on the forward mesa planes. The wet etching results in element isolation. Then, the resist pattern 103 is removed, and an electrode, either a p-side electrode or an n-side electrode, is formed on the upper surface of the semiconductor layer 102. After removing the GaAs substrate 101, an electrode of the opposite polarity, either a p-side electrode or an n-side electrode, is formed on the exposed lower surface of the semiconductor layer 102. The light-emitting diode of interest is manufactured in this manner, as illustrated in FIG. 16.

As illustrated in FIG. 16, the cross sectional shape of the semiconductor layer 102 is bilaterally symmetrical, and the angles made by side faces 102b with respect to the principal surface of the semiconductor layer 102 are about 54.7°. In this case, the light that emerges from the active layer 102a is efficiently reflected off the side faces 102b of the semiconductor layer 102 into the lower surface (light extracting face) of the semiconductor layer 102. This enables the light to be extracted with improved efficiency. FIG. 17 illustrates the measurement result of the light radiation distribution of the light-emitting diode. It can be seen from FIG. 17 that the light radiation distribution is bilaterally symmetrical.

A method is known in which a semiconductor layer to form a light-emitting diode structure is grown on a GaAs substrate whose principal surface is tilted by a predetermined angle in the [110] direction with respect to the (001) plane. This method is commonly used for the growth of a semiconductor layer 102 of a ternary or quaternary compound semiconductor having a zincblende crystal structure. According to this method, as illustrated in FIG. 18A, a light-emitting diode structure-forming semiconductor layer 202 is first grown on a GaAs substrate 201 whose principal surface is tilted by a predetermined angle in the [110] direction with respect to the (001) plane. The semiconductor layer 202 includes an active layer 202a, and additional layers such as an n-type clad layer and a p-type clad layer. Then, as illustrated in FIG. 18B, a resist pattern 203 having a rectangular planar shape is formed on the semiconductor layer 202. The planar shape of the resist pattern 203 is the same as that shown in FIG. 15. Next, as illustrated in FIG. 18C, the semiconductor layer 202 is patterned by wet etching using the resist pattern 203. The resist pattern 203 is then removed, and an electrode, either a p-side electrode or an n-side electrode, is formed on the upper surface of the semiconductor layer 202. After removing the GaAs substrate 201, an electrode of the opposite polarity, either a p-side electrode or an n-side electrode, is formed on the exposed lower surface of the semiconductor layer 202. The light-emitting diode of interest is manufactured in this manner, as illustrated in FIG. 19.

SUMMARY

However, in the manufacturing method of FIGS. 18A to 18C, the off direction of the principal surface of the GaAs substrate 201 is set to intersect with the (111) and (−1-11) planes that lie on the forward mesa planes. Thus, the cross sectional shape of the semiconductor layer 202 after the wet etching usually becomes bilaterally asymmetrical by reflecting the off angle of the principal surface of the GaAs substrate 201. For example, when the GaAs substrate 201 is used that is tilted 15° in the [110] direction with respect to the (001) plane, the angle made by one of the side faces 202b of the semiconductor layer 202 with respect to the principal surface of the semiconductor layer 202 after the wet etching becomes 40°, whereas the angle made by the other side face 202b is 28°, as illustrated in FIG. 19.

FIG. 20 shows the measurement result of the light radiation distribution of the light-emitting diode. It can be seen from FIG. 20 that the light radiation distribution is bilaterally asymmetrical. This is due to weak front radiation, as the emergent rays from the active layer 202a directed to the low-angle (28°) side face 202b travel towards the side opposite from the light extracting face of the semiconductor layer 202.

As described above, in the light-emitting diode of related art illustrated in FIG. 19, because the light from the active layer 202a is reflected at the bilaterally asymmetrical side faces 202b of the semiconductor layer 202, the light extracted from the light-emitting diode is usually affected by the tilt angle of the side faces 202b. The light distribution of the light-emitting diode is therefore bilaterally asymmetrical, and the light intensity varies to a large extent depending on the viewing angle.

Accordingly, there is a need for a light-emitting diode and a manufacturing method thereof that can produce a bilaterally symmetrical light distribution.

According to an embodiment, there is provided a method for manufacturing a light-emitting diode. The method includes:

growing a light-emitting diode structure-forming semiconductor layer of a compound semiconductor having a zincblende crystal structure on a first substrate formed of a compound semiconductor having a zincblende crystal structure and that has a principal surface tilted in a [110] direction with respect to a (001) plane;

bonding the first substrate to a second substrate on the side of the semiconductor layer;

removing the first substrate so as to expose the semiconductor layer;

forming an etching mask on the exposed surface of the semiconductor layer in a rectangular planar shape so that a longer side extends in a [110] or [−1-10] direction, and that a shorter side extends in a [−110] or [1-10] direction; and patterning the semiconductor layer by wet etching using the etching mask.

Typically, the semiconductor layer after being patterned by wet etching using the etching mask has a reverse trapezoidal (reverse mesa configuration) cross sectional shape in a direction parallel to the shorter side of the etching mask, and has two side faces parallel to the longer side of the etching mask and that lie on (1-11) and (−111) planes, respectively. The tilt angle (off angle) α of the principal surface of the first substrate with respect to the (001) plane is, for example, $0<\alpha\leq20°$. Typically, the compound semiconductor forming the first substrate, and the compound semiconductor forming the semiconductor layer are III-V compound semiconductors or II-VI compound semiconductors.

Specific examples of light-emitting diodes using III-V compound semiconductors or II-VI compound semiconductors are presented below with the emission wavelength band.

| Heterojunction | Emission Wavelength |
|---|---|
| 1. III-V compound semiconductor | |
| GaInP/AlGaInP | Red |
| GaInP/AlGaP | Red |
| AlGaAs/InGaAs | Red |
| AlGaAs/AlGaP | Red |
| GaInAsP/GaP | Infrared |
| GaInNP/AlGaP | Infrared |
| GaAs/AlGaAs | Infrared |
| 2. II-VI compound semiconductor | |
| ZnO/ZnMgO | Blue |
| ZnTe/ZnMgTe | Green |
| ZnCdSe/BeZnTe | Yellow-green |
| MgSe/BeZnTe | Yellow-green |
| MgSe/ZnCdSe | Yellow-green |

Specific examples of the III-V compound semiconductor includes GaP, GaAs, GaSb, AlP, AlAs, AlSb, InP, InAs, InSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb.

Specific examples of the II-V compound semiconductor include CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe.

The etchant (etching liquid) used for the wet etching is appropriately selected according to the type of semiconductor used for the semiconductor layer. When the compound semiconductor forming the semiconductor layer is a phosphorous compound semiconductor, hydrochloric acid cooled to a temperature below 5° C. is preferably used as the etchant for the wet etching of the semiconductor layer.

According another embodiment of the present invention, there is provided a light-emitting diode including a semiconductor layer formed of a compound semiconductor having a zincblende crystal structure and that forms a light-emitting diode structure, wherein the semiconductor layer has a trapezoidal cross sectional shape in one direction, an upper base-side principal surface tilted in a [110] direction with respect to a (001) plane, and two side faces that lie on (1-11) and (−111) planes, respectively.

The descriptions made in conjunction with the light-emitting diode manufacturing method also apply to the light-emitting diode.

According to still another embodiment, there is provided a method for manufacturing a light-emitting diode. The method includes:

growing a light-emitting diode structure-forming semiconductor layer of a compound semiconductor having a zincblende crystal structure on a substrate formed of a compound semiconductor having a zincblende crystal structure and that has a principal surface tilted in a [−110] direction with respect to a (001) plane;

forming an etching mask on the semiconductor layer in a rectangular planar shape so that a longer side extends in a [−110] or [1-10] direction, and that a shorter side extends in a [110] or [−1-10] direction; and patterning the semiconductor layer by wet etching using the etching mask.

The descriptions made in conjunction with the foregoing light-emitting diode manufacturing method also apply to this manufacturing method.

According to yet another embodiment, there is provided a light-emitting diode including a semiconductor layer formed of a compound semiconductor having a zincblende crystal structure and that forms a light-emitting diode structure, wherein the semiconductor layer has a trapezoidal cross sectional shape in one direction, an upper base-side principal surface tilted in a [−110] direction with respect to a (001) plane, and two side faces that lie on (111) and (−1-11) planes, respectively.

The descriptions made in conjunction with the foregoing light-emitting diode manufacturing method also apply to the light-emitting diode.

In various embodiments, the size of the light-emitting diode is not particularly limited, and is generally 50 μm or less, typically 10 μm or more in the maximum dimension.

According to the foregoing configurations of the present application, the tilt direction of the substrate principal surface with respect to the (001) plane does not intersect with the side faces formed by wet etching on the semiconductor layer. Thus, the cross sectional shape of the semiconductor layer after the wet etching is bilaterally symmetrical, and the angles made by the side faces with respect to the principal surface of the semiconductor layer are equal to each other.

Because the cross sectional shape of the semiconductor layer is bilaterally symmetrical, and because the angles made by the side faces with respect to the principal surface of the semiconductor layer are equal to each other, the light extracted from the semiconductor layer is not affected by the tilt angle of the side faces of the semiconductor layer. The light-emitting diode is therefore able to produce a bilaterally symmetrical light distribution. There accordingly will be only limited viewing-angle-dependent changes in the light intensity of the light-emitting diode.

Additional features and advantages are described herein, and will be apparent from the following Detailed Description and the figures.

BRIEF DESCRIPTION OF THE FIGURES

FIGS. 6A and 6B are an outlined line drawing and an optical micrograph representing the etched shape of a semiconductor layer of a light-emitting diode manufactured by a light-emitting diode manufacturing method of related art using a (100) 15° off substrate; FIG. 6C is a photoluminescence photographic image of the semiconductor layer.

FIGS. 7A and 7B are an outlined line drawing and an optical micrograph representing the etched shape of a semiconductor layer of a light-emitting diode manufactured by a light-emitting diode manufacturing method of the first embodiment of the present invention using a (100) just substrate; FIG. 7C is a photoluminescence photographic image of the semiconductor layer.

FIGS. 8A and 8B are an outlined line drawing and an optical micrograph representing the etched shape of a semiconductor layer of a light-emitting diode manufactured by a light-emitting diode manufactured by a light-emitting diode manufacturing method of the first embodiment of the present invention; FIG. 8C is a photoluminescence photographic image of the semiconductor layer.

FIG. 17 is an outlined line drawing showing a light radiation distribution of a light-emitting diode of related art shown in FIG. 16.

DETAILED DESCRIPTION

The present application is described below with reference to the drawings according to an embodiment. Descriptions will be made in the following order.

1. First Embodiment (light-emitting diode manufacturing method and light-emitting diode)

2. Second Embodiment (light-emitting diode manufacturing method and light-emitting diode)

1. First Embodiment

Light-Emitting Diode Manufacturing Method and Light-Emitting Diode

A light-emitting diode manufacturing method according to a first embodiment is described below.

Figure 1A:
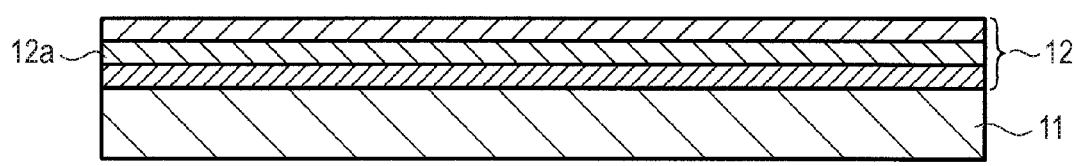
FIGS. 1A to 1C are cross sectional views explaining a light-emitting diode manufacturing method according to a first embodiment.

As illustrated in FIG. 1A, a semiconductor layer 12 of a compound semiconductor having a zincblende crystal structure is first grown on a substrate (hereinafter, "A-off substrate") 11 formed of a compound semiconductor having a zincblende crystal structure and that has a principal surface tilted by a predetermined angle in the [110] direction with respect to the (001) plane. The tilt angle α of the principal surface of the A-off substrate 11 with respect to the (001) plane is selected as needed. For example, the tilt angle α is $0°<α≦20°$. Examples of the compound semiconductor used for the semiconductor layer 12 include III-V compound semiconductors such as AlGaInP semiconductors and GaAs semiconductors, and II-VI compound semiconductors such as ZnSe semiconductors. The semiconductor layer 12 includes an active layer 12a, and additional layers such as an n-type clad layer and a p-type clad layer.

Figure 1B:
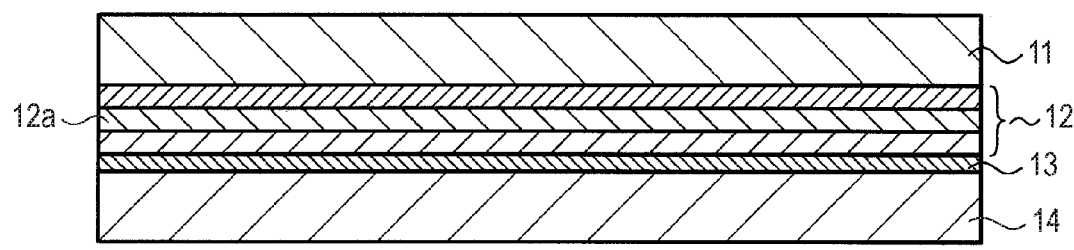

Then, as illustrated in FIG. 1B, the A-off substrate 11 is bonded to a support substrate 14 with an adhesive 13 on the side of the semiconductor layer 12. Various types of substrates can be used for the support substrate 14. Examples include a sapphire substrate and a silicon substrate.

Figure 1C:
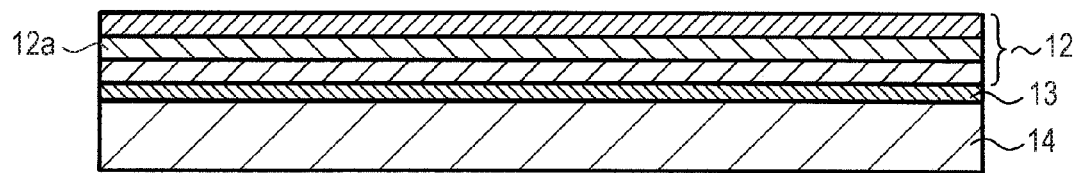

Thereafter, as illustrated in FIG. 1C, the A-off substrate 11 is removed from the back side by a method such as polishing or chemical etching to expose the semiconductor layer 12.

Figure 2A:
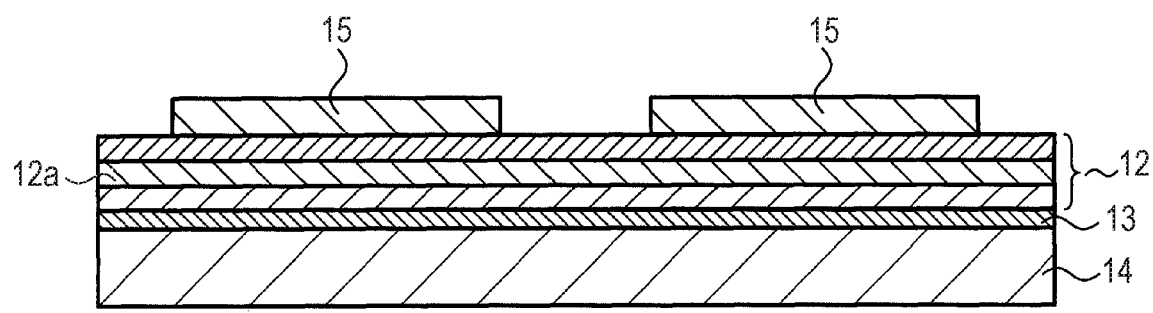
FIGS. 2A and 2B are cross sectional views explaining a light-emitting diode manufacturing method according to the first embodiment.
Figure 3:
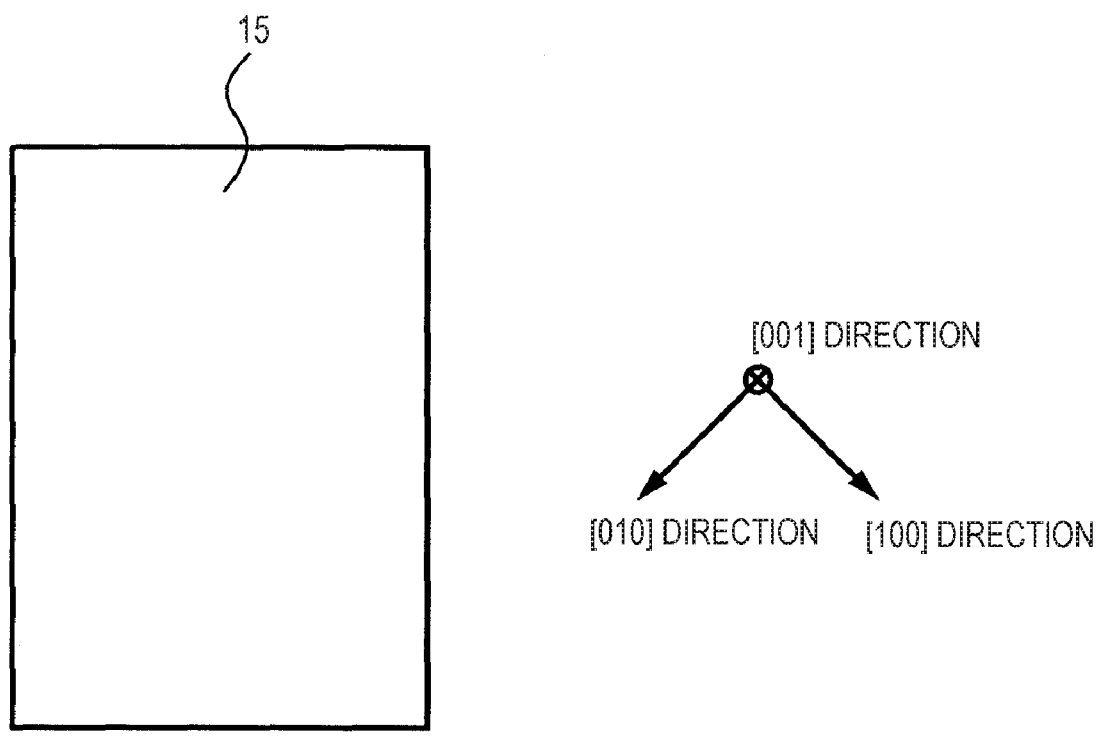
FIG. 3 is a plan view illustrating a resist pattern used as an etching mask in the light-emitting diode manufacturing method according to the first embodiment.

Next, as illustrated in FIG. 2A, a resist pattern 15 of a rectangular planar shape is formed on the exposed surface of the semiconductor layer 12 by lithography. As illustrated in FIG. 3, the resist pattern 15 is formed in such a manner that the longer side extends in the [110] or [−1-10] direction of the semiconductor layer 12, and that the shorter side extends in the [−110] or [1-10] direction of the semiconductor layer 12. The shorter side of the resist pattern 15 is substantially equal in length to the shorter-direction side of the top face of the semiconductor layer 12 after the etching. The longer side of the resist pattern 15 is longer than the longer-direction side of the top face of the semiconductor layer 12 after the etching.

Figure 2B:
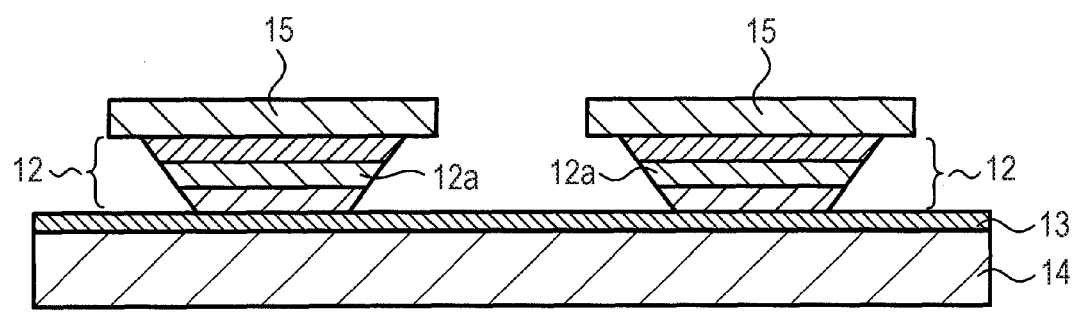

The semiconductor layer 12 is then patterned by wet etching using the resist pattern 15 as an etching mask. This results in element isolation, as illustrated in FIG. 2B. The wet etching etches the semiconductor layer 12 in a reverse mesa configuration, providing a reverse trapezoidal cross sectional shape for the semiconductor layer 12 on a plane parallel to the shorter side of the resist pattern 15. The both side faces of the semiconductor layer 12 are tilted on the (1-11) and (−111) planes, respectively. Though details will be described later, the cross sectional shape of the semiconductor layer 12 is bilaterally symmetrical, and the angles made by the both side faces of the semiconductor layer 12 with respect to the principal surface of the semiconductor layer 12 are equal to each other.

Next, after removing the resist pattern 15, an electrode (not illustrated), either a p-side electrode or an n-side electrode, is formed on the semiconductor layer 12.

The support substrate 14 is then bonded to another support substrate (not illustrated) with an adhesive on the side of the semiconductor layer 12, and the adhesive 13 and the support substrate 14 are removed.

Then, an electrode of the opposite polarity (not illustrated), either a p-side electrode or an n-side electrode, is formed on the semiconductor layer 12 bonded to the support substrate.

Thereafter, the support substrate and the adhesive are removed.

Figure 4:
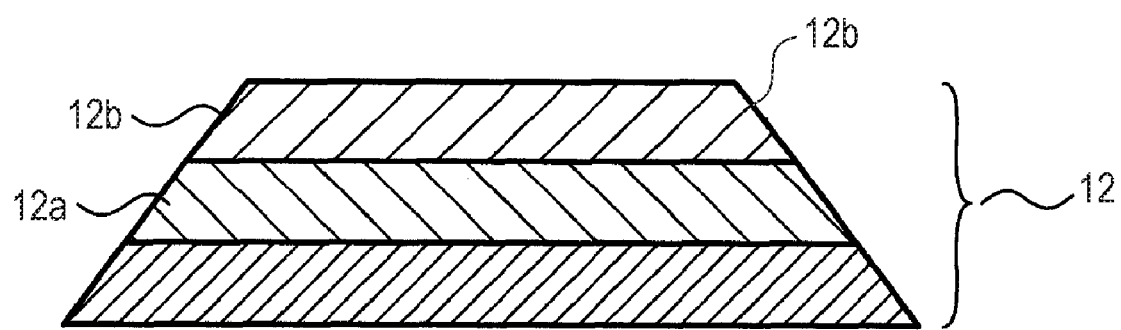
FIG. 4 is a cross sectional view illustrating a light-emitting diode according to the first embodiment.

As a result, as illustrated in FIG. 4, a light-emitting diode is formed that has a bilaterally symmetrical cross sectional shape, and in which the angles made by side faces 12b with respect to the principal surface of the semiconductor layer 12 are equal to each other. The principal surface on the upper base side of the semiconductor layer 12 in the light-emitting diode is tilted by a predetermined angle in the [110] direction with respect to the (001) plane, and the side faces 12b of the semiconductor layer 12 lie on the (1-11) and (−111) planes, respectively. The light-emitting diode may be used as a sole element, or may be bonded, transferred, or wire connected to another substrate, depending on intended use.

As noted above, the wet etching of the semiconductor layer 12 using the resist pattern 15 as an etching mask provides a bilaterally symmetrical cross sectional shape for the semiconductor layer 12, and the angles made by the side faces 12b of the semiconductor layer 12 with respect to the principal surface of the semiconductor layer 12 are equal to each other. The following describes the reasons for these.

Figures 5B, 5C:
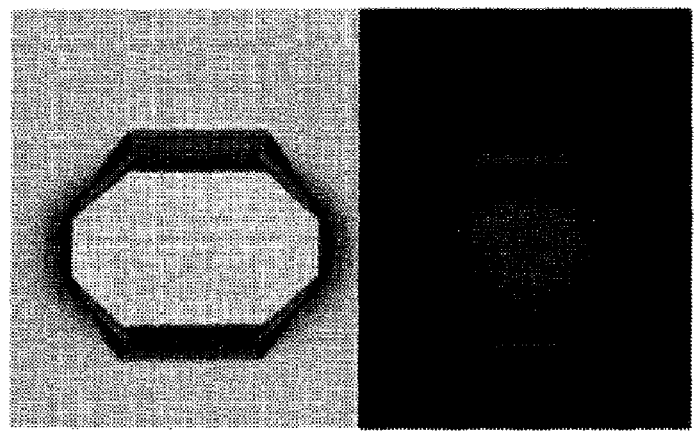
FIGS. 5A and 5B are an outlined line drawing and an optical micrograph representing the etched shape of a semiconductor layer of a light-emitting diode manufactured by a light-emitting diode manufacturing method of related art using a (100) just substrate.
FIG. 5C is a photoluminescence photographic image of the semiconductor layer.
Figure 5A:
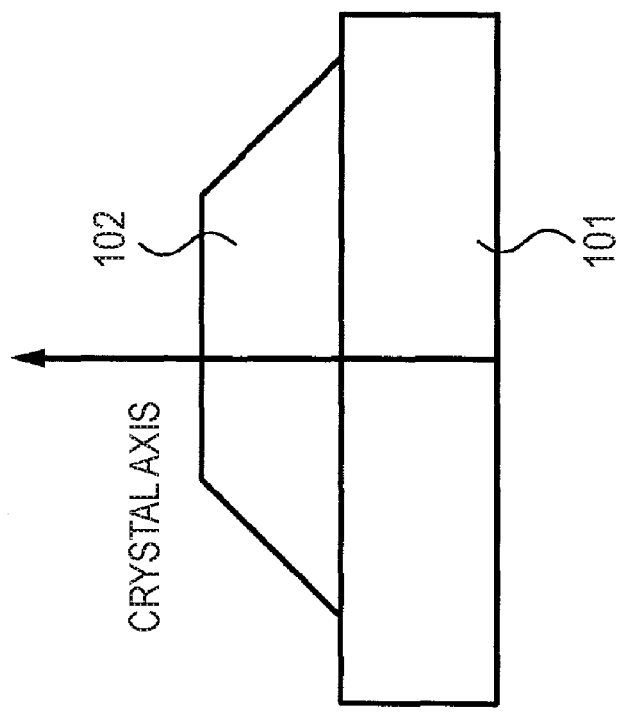
Figure 14A:
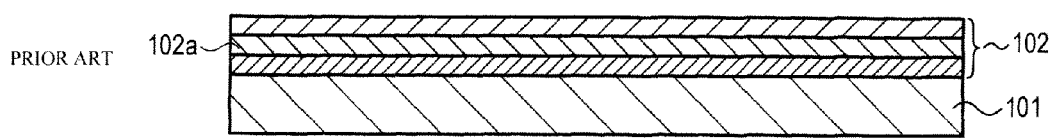
FIGS. 14A to 14C are cross sectional views explaining a light-emitting diode manufacturing method of related art.
Figure 14B:
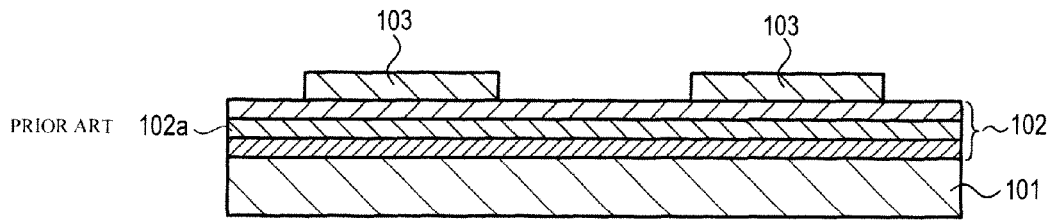
Figure 14C:
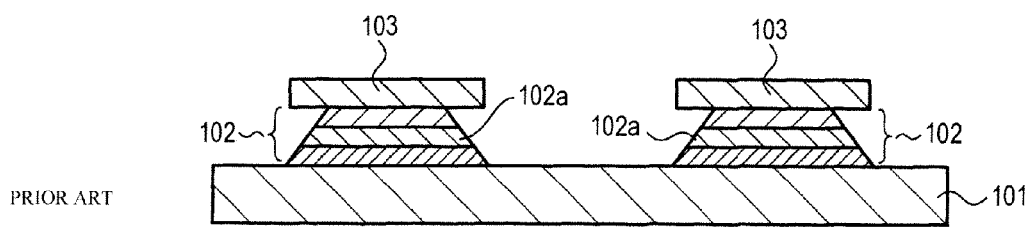
Figure 15:
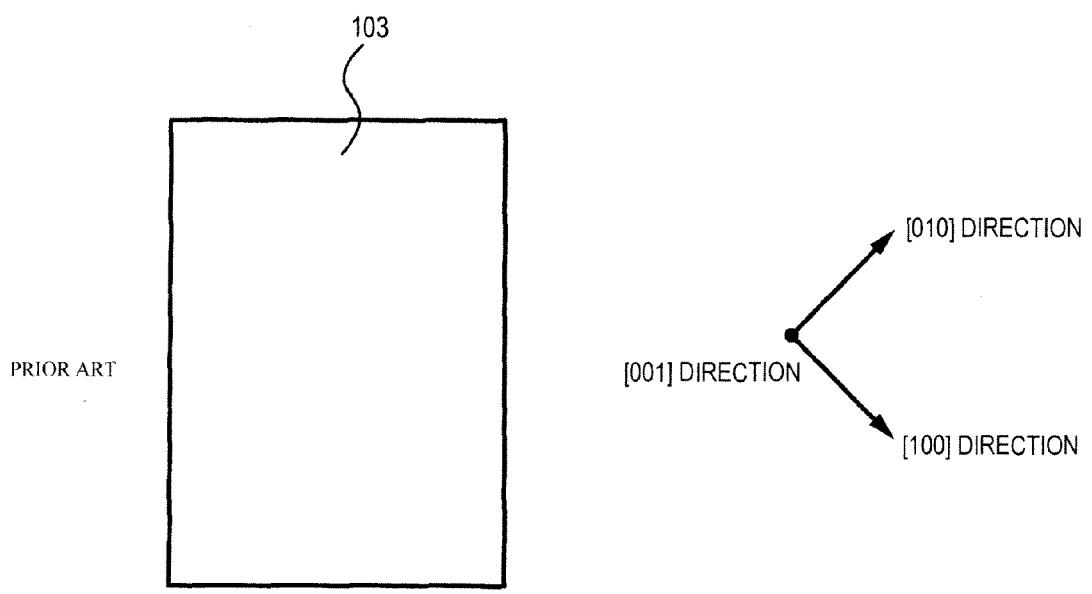
FIG. 15 is a plan view illustrating a resist pattern used as an etching mask in the light-emitting diode manufacturing method of related art shown in FIGS. 14A to 14C.
Figure 16:
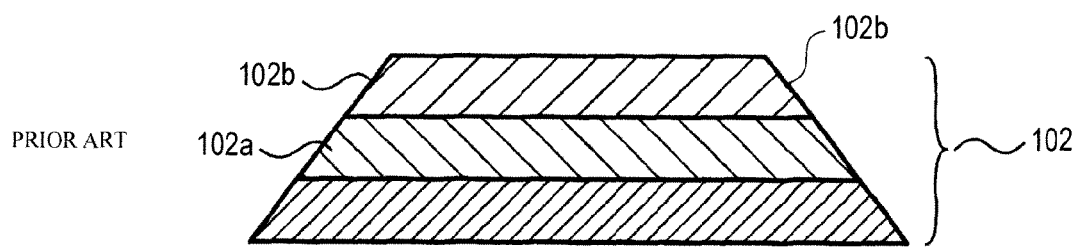
FIG. 16 is a cross sectional view illustrating a light-emitting diode manufactured by the light-emitting diode manufacturing method of related art shown in FIGS. 14A to 14C.

In the light-emitting diode manufacturing method of related art illustrated in FIGS. 14A to 14C, a semiconductor layer 102 is grown on a GaAs substrate 101 (just (0°) substrate) whose principal surface lies on the (001) plane. As such, the wet etching using the resist pattern 103 as an etching mask proceeds as forward mesa etching. The resulting cross sectional shape is bilaterally symmetrical, and the angles made by the side faces 102b with respect to the principal surface of the semiconductor layer 102 are equal to each other (see FIG. 5A). FIG. 5B shows an example of outer dimensions of the semiconductor layer 102 after etching. FIG. 5C shows a photoluminescence image of the semiconductor layer 102. It can be seen from FIG. 5C that the light distribution is bilaterally symmetrical.

Figure 18A:
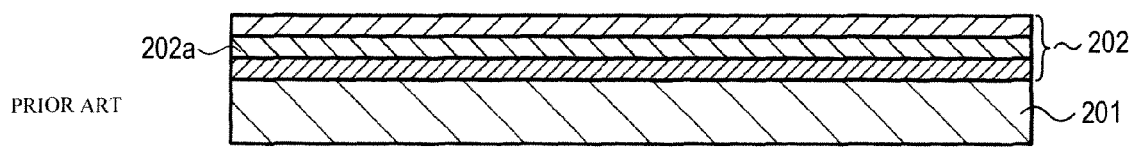
FIGS. 18A to 18C are cross sectional views explaining another light-emitting diode manufacturing method of related art.
Figure 18B:
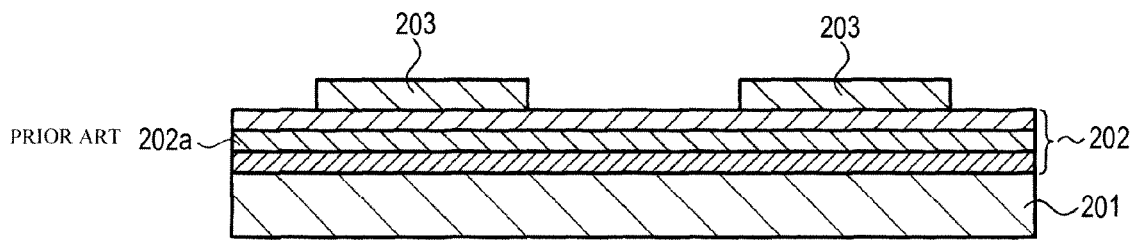
Figure 18C:
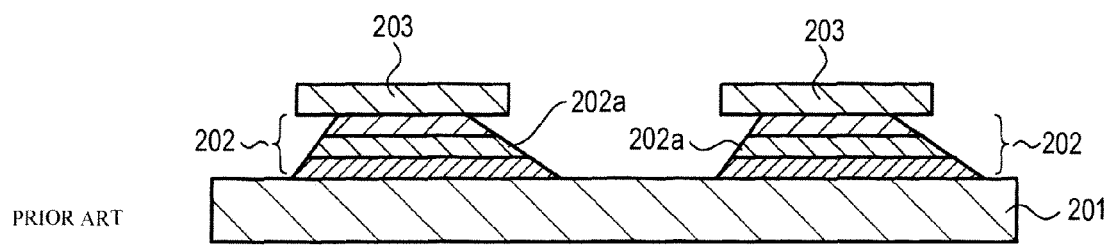
Figure 19:
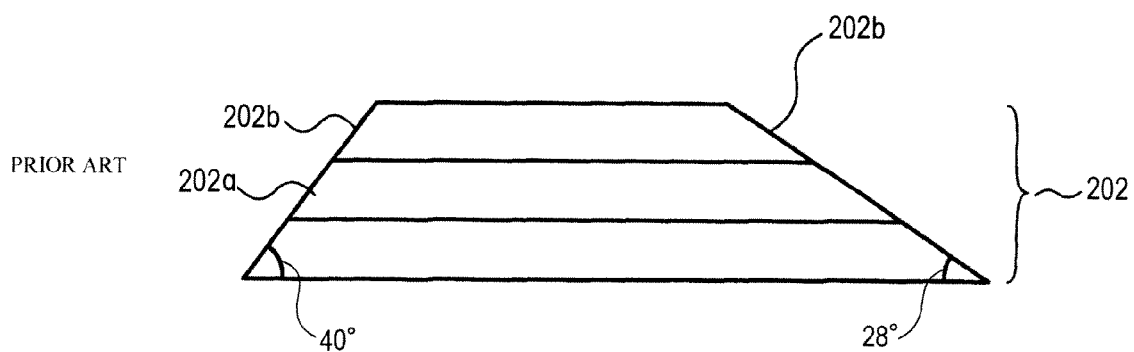
FIG. 19 is a cross sectional view illustrating a light-emitting diode manufactured by the light-emitting diode manufacturing method of related art shown in FIGS. 18A to 18C.
Figure 20:
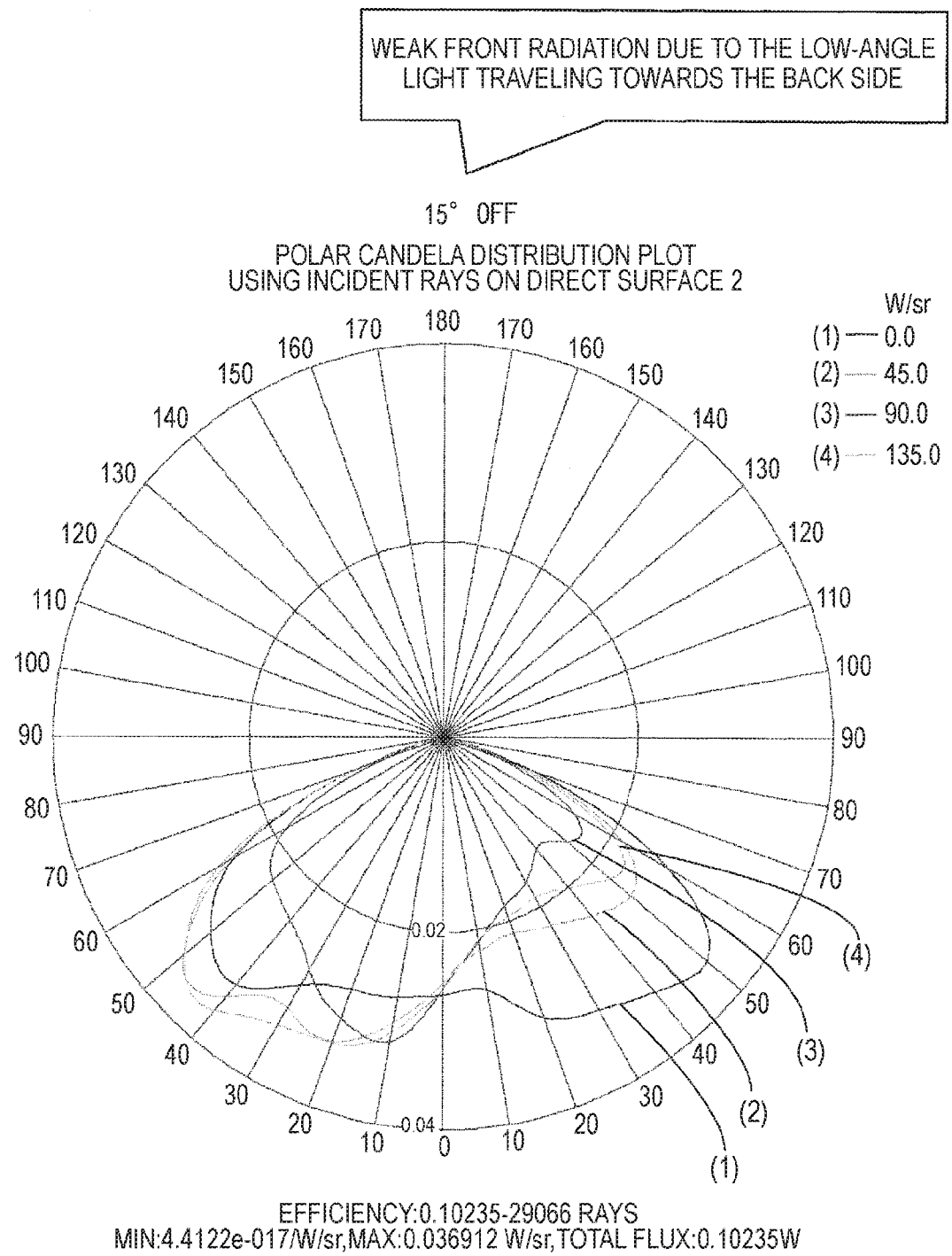
FIG. 20 is an outlined line drawing showing a light radiation distribution of the light-emitting diode of related art shown in FIG. 19.

In the light-emitting diode manufacturing method of related art illustrated in FIGS. 18A to 18C, a semiconductor layer 202 is grown on a GaAs substrate 201 (15° A-off substrate) whose principal surface is tilted, for example, 15° in the [110] direction with respect to the (001) plane. As such, the forward mesa etching performed by wet etching using the resist pattern 203 as an etching mask results in a configuration in which the direction parallel to the shorter side of the resist pattern 203 coincides with the [110] tilt direction of the principal surface of the GaAs substrate 201. Because the off angle of the principal surface of the GaAs substrate 201 is reflected in the cross sectional shape of the semiconductor layer 202 in a direction parallel to the shorter side of the resist pattern 203, the cross sectional shape is bilaterally asymmetrical, and the angles made by the side faces 202b with respect to the principal surface of the semiconductor layer 202 are different from each other (see FIG. 6A). FIG. 6B shows an example of outer dimensions of the semiconductor layer 202 after etching. FIG. 6C shows a photoluminescence image of the semiconductor layer 202. It can be seed from FIG. 6C that the light distribution is bilaterally asymmetrical.

When reverse mesa etching is performed by wet etching using a resist pattern 14 as an etching mask from the back face side of the semiconductor layer 12 grown on a GaAs substrate (just (0°) substrate) whose principal surface lies on the (001) plane, the resulting cross sectional shape is bilaterally symmetrical, and the angles made by the both side faces with respect to the principal surface of the semiconductor layer 12 are equal to each other (see FIG. 7A). FIG. 7B shows an example of outer dimensions of the semiconductor layer 12 after etching. FIG. 7C shows a photoluminescence image of the semiconductor layer 12. It can be seen from FIG. 7C that the light distribution is bilaterally symmetrical.

The following considers the case as in the light-emitting diode manufacturing method of the present first embodiment in which reverse mesa etching is performed by wet etching using the resist pattern 14 as an etching mask from the back face side of the semiconductor layer 12 grown on a substrate 11 (15° A-off substrate) whose principal surface is tilted, for example 15° in the [110] direction with respect to the (001) plane. Because the reverse mesa etching is performed by wet etching from the back face side of the semiconductor layer 12, the [110] tilt direction of the principal surface of the A-off substrate 11 is rotated 90° from that shown in FIG. 6A, and becomes parallel to the side faces 12b of the semiconductor layer 12 obtained by the reverse mesa etching. That is, in this case, the off angle of the principal surface of the A-off substrate 11 is not reflected in the cross sectional shape of the semiconductor layer 12 in a direction parallel to the shorter side of the resist pattern 15. Accordingly, the cross sectional shape is bilaterally symmetrical, and the angles made by the side faces 12b with respect to the principal surface of the semiconductor layer 12 are equal to each other (see FIG. 8A). FIG. 8B shows an example of outer dimensions of the semiconductor layer 12 after etching. FIG. 8C shows a photoluminescence image of the semiconductor layer 12. It can be seen from FIG. 8C that the light distribution is bilaterally symmetrical. The foregoing descriptions also apply when the [110] tilt angle of the principal surface of the substrate 11 with respect to the (001) plane is other than 15°.

Figure 9A:
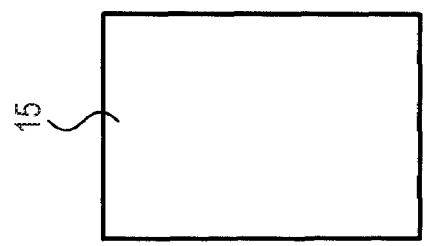
FIGS. 9A to 9C are outlined line drawings explaining the shape of a semiconductor layer subjected to wet etching in a light-emitting diode manufacturing method according to the first embodiment.
Figure 9B:
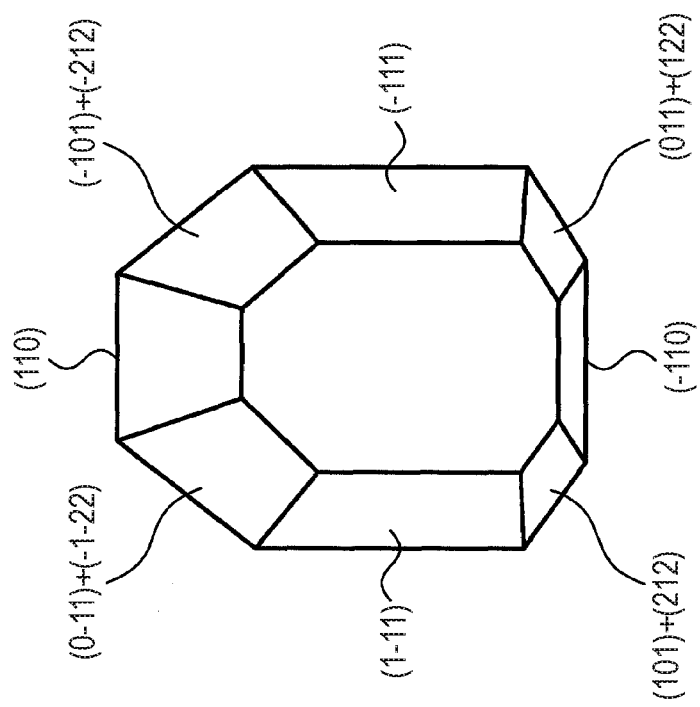
Figure 9C:
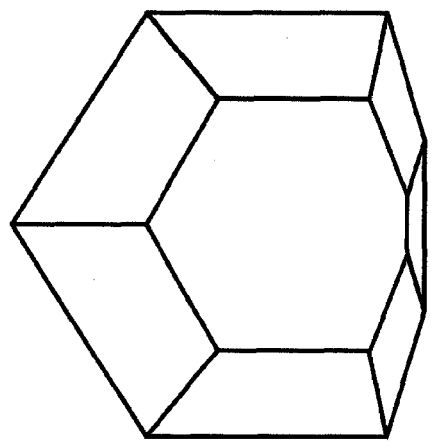

FIGS. 9A to 9C illustrate the shape of the semiconductor layer 12 subjected to reverse mesa wet etching, and the orientation of the resulting crystal planes that appear on the surfaces, taking as an example an A-off substrate 12 whose principal surface is tilted 15° in the [110] direction with respect to the (001) plane. The wet etching of the semiconductor layer 12 using the resist pattern 15 shown in FIG. 9A as an etching mask initially proceeds as shown in FIG. 9B. Specifically, a (1-11) and a (-111) plane appear along the longer side of the resist pattern 15, and a (110) and a (-110) plane appear along the shorter side of the resist pattern 15. A (011)+(122) plane, a (-101)+(-212) plane, a (0-11)+(-1-22) plane, and a (101)+(212) plane appear in portions of the semiconductor layer 12 corresponding to the four corners of the resist pattern 15. The etching proceeds to side-etch the semiconductor layer 12 in portions corresponding to the four corners of the resist pattern 15, shaping the semiconductor layer 12 as illustrated in FIG. 9C.

Figure 10A:
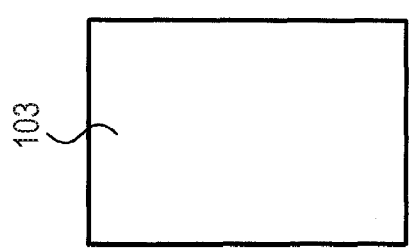
FIGS. 10A to 10C are outlined line drawings explaining the shape of a semiconductor layer subjected to wet etching in a light-emitting diode manufacturing method of related art.
Figure 10B:
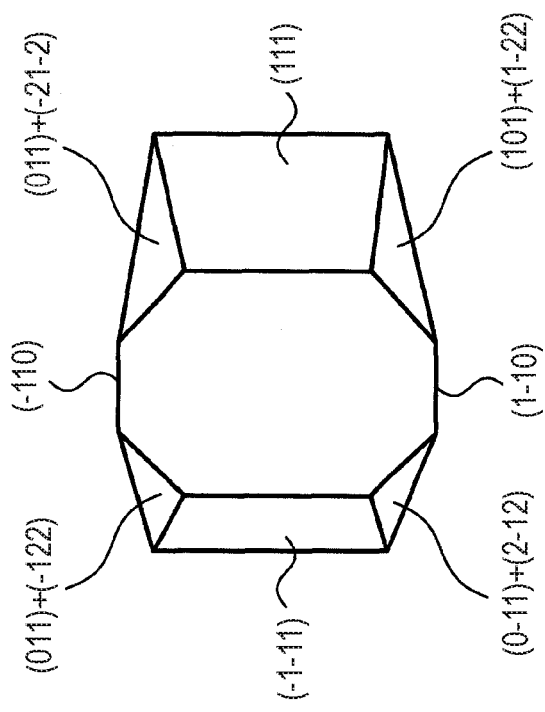
Figure 10C:
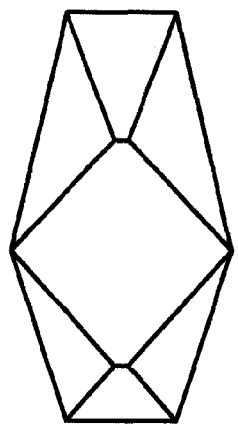

For comparison, FIGS. 10A to 10C illustrate the shape of the semiconductor layer 202 and the orientation of the resulting crystal planes that appear on the surfaces after the forward mesa wet etching of the semiconductor layer 202 grown on the GaAs substrate 201 whose principal surface is tilted, for example, 15° in the [110] direction with respect to the (001) plane as in the light-emitting diode manufacturing method of related art illustrated in FIGS. 18A to 18C.

EXAMPLE

A manufacturing method of an AlGaInP light-emitting diode is described.

A GaAs substrate having a principal surface tilted 15° in the [110] direction with respect to the (001) plane is used as an A-off substrate 11. A semiconductor layer 12 of an AlGaInP semiconductor is then grown on the GaAs substrate at a temperature of, for example, about 800° C. using a metal organic chemical vapor deposition (MOCVD) method. The semiconductor layer 12 includes, from the bottom, an n-type GaAs layer, an n-type AlGaInP clad layer, an active layer of a multiquantum well (MQW) structure, a p-type AlGaInP clad layer, and a p-type GaAs layer. Specifically, the MQW structure of the active layer is a $Ga_{0.5}In_{0.5}P$ well layer, and an $(Al_{0.5}Ga_{0.5})_{0.5}In_{0.5}P$ barrier layer.

The growth material of the AlGaInP semiconductor is as follows. The raw material of Ga is, for example, trimethylgallium ($(CH_3)_3Ga$, TMG). The raw material of Al is, for example, trimethylaluminum ($(CH_3)_3Al$, TMA). The raw material of In is, for example, trimethylindium ($(CH_3)_3In$, TMI). The raw material of P is, for example, phosphine ($PH_3$). As to the dopant, for example, hydrogen selenide ($H_2Se$) and dimethylzinc ($(CH_3)_2Zn$, DMZn) are used as an n-type dopant and a p-type dopant, respectively.

The A-off substrate 11 is then bonded to a support substrate 14 with an adhesive 13 on the side of the semiconductor layer 12.

Then, the A-off substrate 11, specifically the GaAs substrate, is removed by, for example, polishing or wet etching using an ammonia-based etchant to expose the semiconductor layer 12.

A resist pattern 15 is then formed on the exposed surface of the semiconductor layer 12 by lithography.

Next, the semiconductor layer 12 is patterned by wet etching using the resist pattern 15 as an etching mask. Specifically, the n-type GaAs layer, the n-type AlGaInP clad layer, the active layer, the p-type AlGaInP clad layer, and the p-type GaAs layer are sequentially etched by wet etching. Here, the etching of the n-type GaAs layer is performed with an ammonia-based etchant. After etching the n-type GaAs layer, the semiconductor layer 12 is washed with running water, and dried.

This is followed by etching of the n-type AlGaInP clad layer, the active layer, and the p-type AlGaInP clad layer using an etchant containing hydrochloric acid cooled to, for example, a temperature below 5° C., preferably 0° C. or less, more preferably −5° C. or less, further preferably −10° C. or less. Specifically, the etchant is, for example, a 36% hydrochloric acid aqueous solution cooled to −15° C. The etchant containing hydrochloric acid non-selectively etches the AlGaInP semiconductor. Preferably, the etching is performed twice, with the first and second etching times of, for example, 150 seconds and 90 seconds, respectively. In this case, the 150-second first etching proceeds to the p-type GaAs layer in the [001] direction. At this stage, because the etching is incomplete on the side faces that lie on the {111} planes of the semiconductor layer 12, the tilt angle has not been determined. Thus, the 90-second second etching is additionally performed to provide a desired tilt angle for the side faces 12b of the semiconductor layer 12. Because the etching in the [001] direction completes in the first etching, the side etching accelerates in the {010} and {221} plane directions (see FIGS. 9B and 9C).

Finally, the p-type GaAs layer is etched using a phosphoric acid mixture (phosphoric acid:hydrogen peroxide:water=6:2:100) as an etchant. The etching time is 90 seconds.

After the element isolation performed as above, the resist pattern 15 is removed.

Then, a resist pattern (not illustrated) of a predetermined planar shape is formed on the surface of the semiconductor layer 12 by lithography. After sequentially forming, for example, a Pd film, a AuGe film, and a Au film over the whole surface by, for example, sputtering, the resist pattern is removed with the Pd film, the AuGe film, and the Au film formed thereon (liftoff). As a result, a rectangular planar n-side electrode of a Pd/AuGe/Au structure is formed on the n-type GaAs layer. The n-type GaAs layer is then removed by etching, excluding the n-side electrode portion.

The side of the semiconductor layer 12 with the n-side electrode is then bonded to another support substrate, for example, a sapphire substrate, and the adhesive 13 and the support substrate 14 are removed.

Then, a resist pattern (not illustrated) of a predetermined planar shape is formed on the exposed surface of the semiconductor layer 12 by lithography, and, for example, a Au film, a Pt film, and a Au film are sequentially formed over the whole substrate surface by, for example, sputtering. The resist pattern is then removed with the Au film, the Pt film, and the Au film formed thereon (liftoff). As a result, a rectangular planar p-side electrode of a Au/Pt/Au structure is formed on the p-type GaAs layer. The p-type GaAs layer is then removed by etching, excluding the p-side electrode portion.

This completes the formation of the light-emitting diode of interest.

As described above, in the first embodiment, the semiconductor layer 12 is grown on the A-off substrate 11 whose principal surface is tilted by a predetermined angle in the [110] direction with respect to the (001) plane, and the A-off substrate 11, after being bonded to the support substrate 14 on the side of the semiconductor layer 12, is removed from the back face side to expose the semiconductor layer 12. After forming the resist pattern 15 on the exposed surface of the semiconductor layer 12, the semiconductor layer 12 is reverse mesa etched by wet etching using the resist pattern 15 as an etching mask. Thus, the tilt angle of the A-off substrate 11 is not reflected in the cross sectional shape of the semiconductor layer 12 in a direction parallel to the shorter side of the resist pattern 15. Accordingly, the semiconductor layer 12 has a bilaterally symmetrical cross sectional shape, and the angles made by the side faces 12b of the semiconductor layer 12 with respect to the principal surface of the semiconductor layer 12 becomes equal to each other. As a result, during the operation of the light-emitting diode, the distribution of extracted light from the semiconductor layer 12 becomes bilaterally symmetrical along the semiconductor layer 12. In other words, the light-emitting diode produces a bilaterally symmetrical light distribution. There accordingly will be only limited viewing-angle-dependent changes in the light intensity of the light-emitting diode.

The light-emitting diode is suitable for various types of electronic devices, including LED displays, LED backlights, and LED illumination.

2. Second Embodiment

Light-Emitting Diode Manufacturing Method and Light-Emitting Diode

A light-emitting diode manufacturing method according to a second embodiment is described below.

Figure 21:
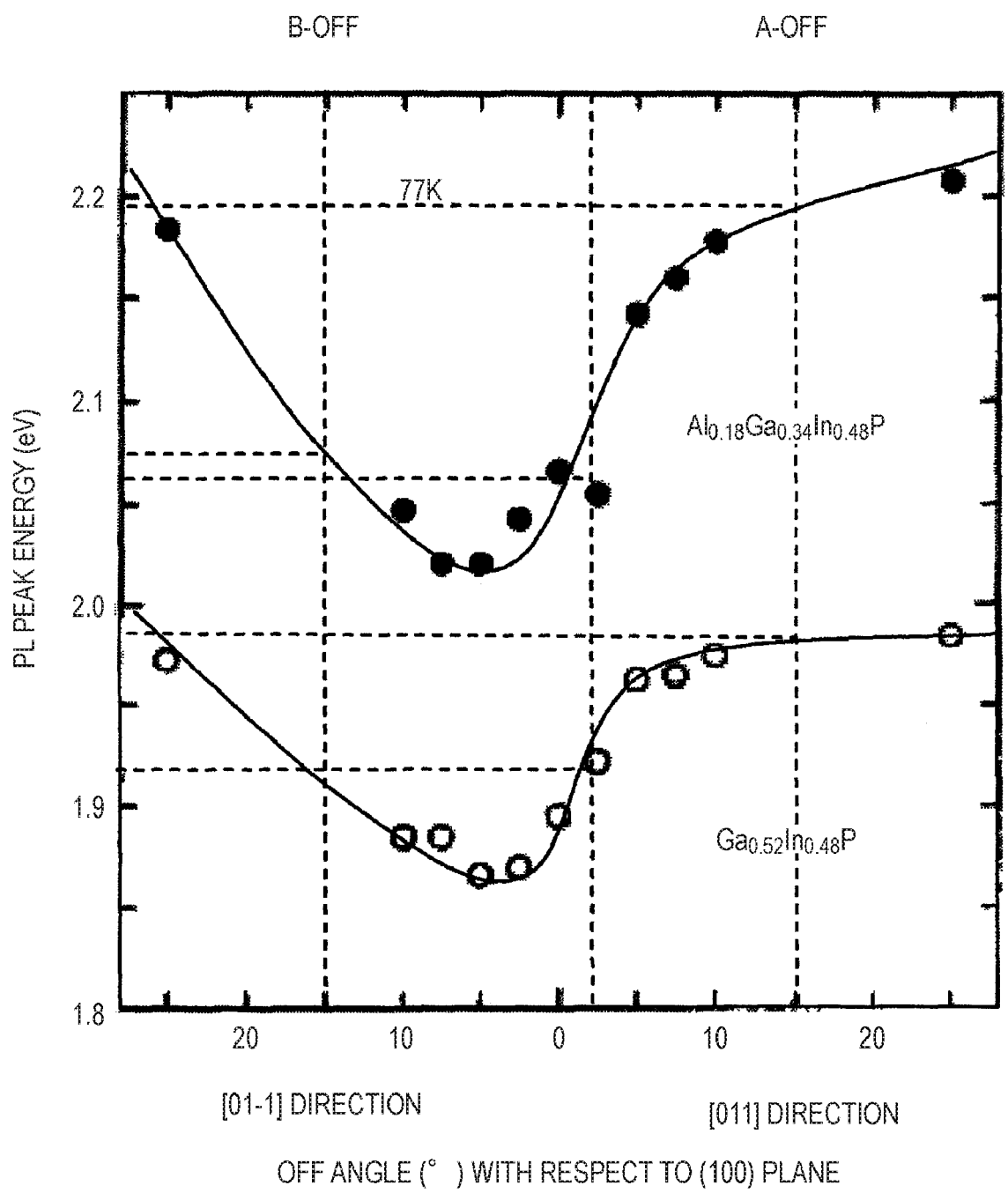
FIG. 21 is a graph representing changes in energy band with an off substrate.
Figure 22:
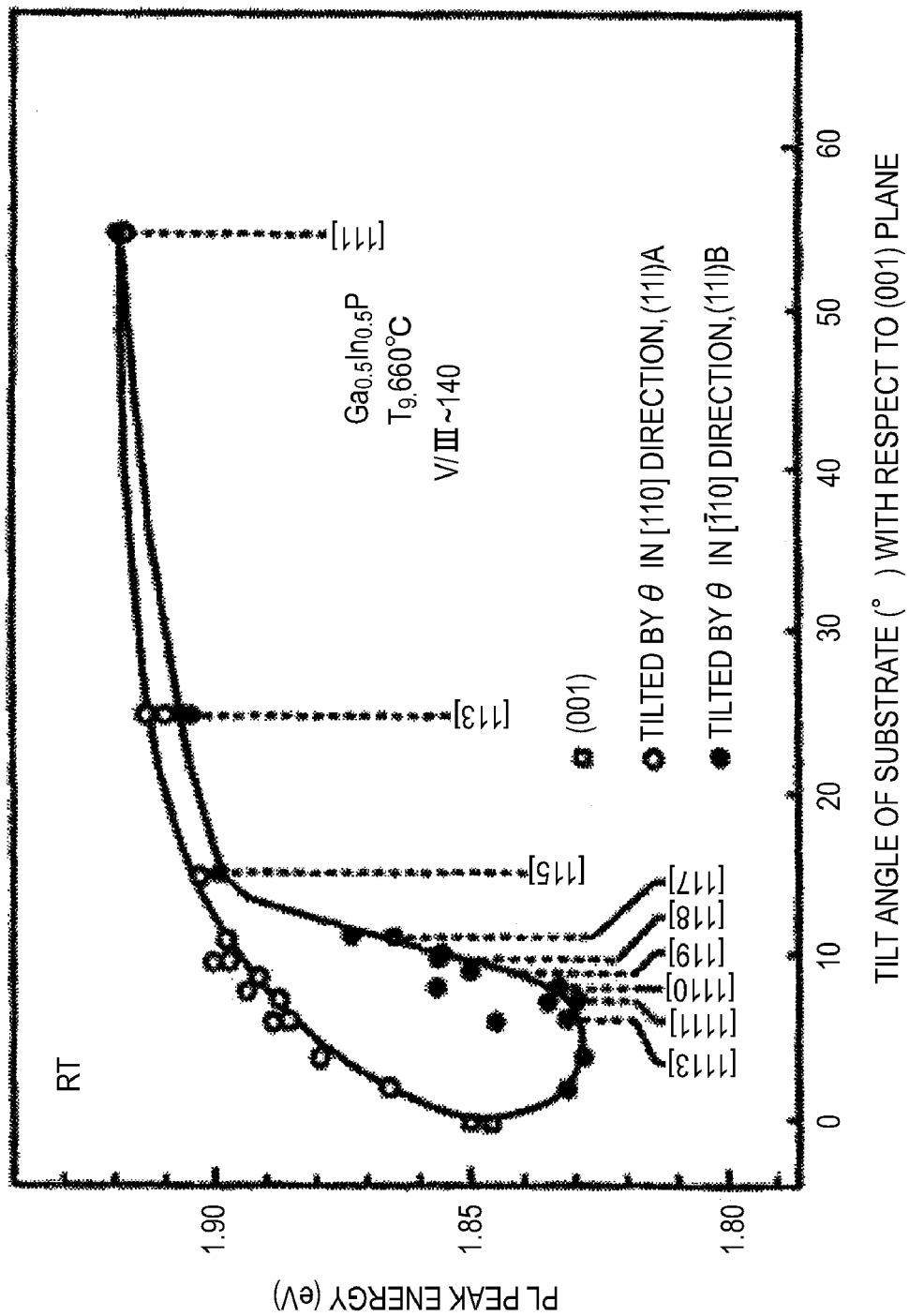
FIG. 22 is a graph representing changes in energy band with an off substrate.

In contrast to the first embodiment in which the A-off substrate 11 whose principal surface is tilted by a predetermined angle in the [110] direction with respect to the (001) plane is used, the second embodiment uses a substrate (hereinafter, also referred to as "B-off substrate") 21 whose principal surface is tilted by a predetermined angle in the [−110] direction with respect to the (001) plane. The B-off substrate 21 is not in common use because, when the off angle less than 15°, it creates a large difference in the energy band structure of the semiconductor layer grown thereon, and thus severely lowers properties. Use of the B-off substrate 21 is seen with an off angle of 15° or greater, which stabilizes the energy band structure (see FIGS. 21 and 22, and T. Kobayashi, H. Kojima, R. S. Doel, N. Buchan, W. Heuberger, A. Jakubowicz, and P. Roentgen, *Journal of Physics and Chemistry of Solids*, Volume 56, Issues 3-4, March-April 1995, Pages 311-317).

Figure 11A:
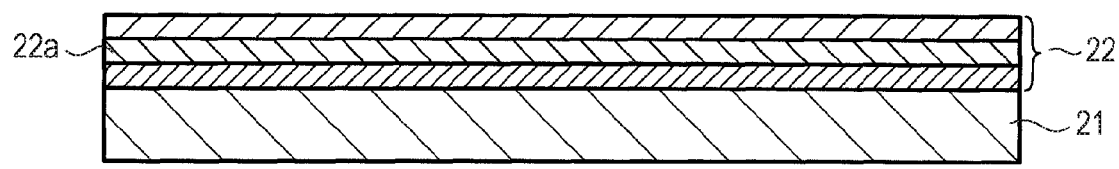
FIGS. 11A to 11C are cross sectional views illustrating a light-emitting diode manufacturing method according to a second embodiment.

In the second embodiment, as illustrated in FIG. 11A, a semiconductor layer 22 of a compound semiconductor having a zincblende crystal structure is first grown on the B-off substrate 21 formed of a compound semiconductor having a zincblende crystal structure and that has a principal surface tilted by a predetermined angle in the [−110] direction with respect to the (001) plane. The semiconductor layer 22 includes an active layer 22a, and additional layers such as an n-type clad layer and a p-type clad layer. The tilt angle β of the principal surface of the B-off substrate 21 with respect to the (001) plane is selected as needed within a range of 15° and greater. For example, the tilt angle β is $15° \leq β \leq 50°$.

Figure 11B:
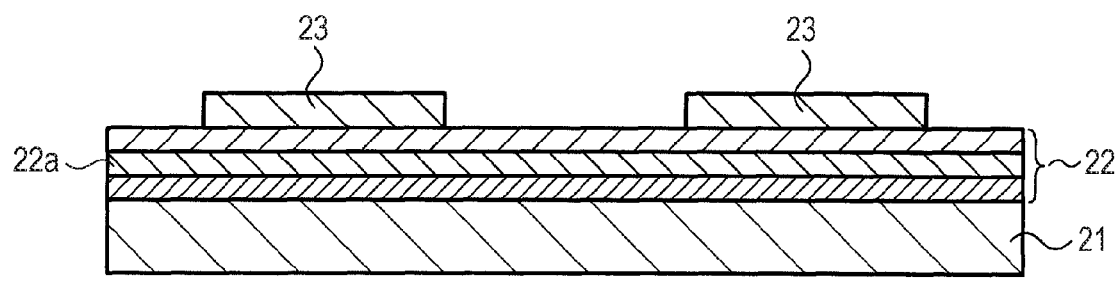
Figure 12:
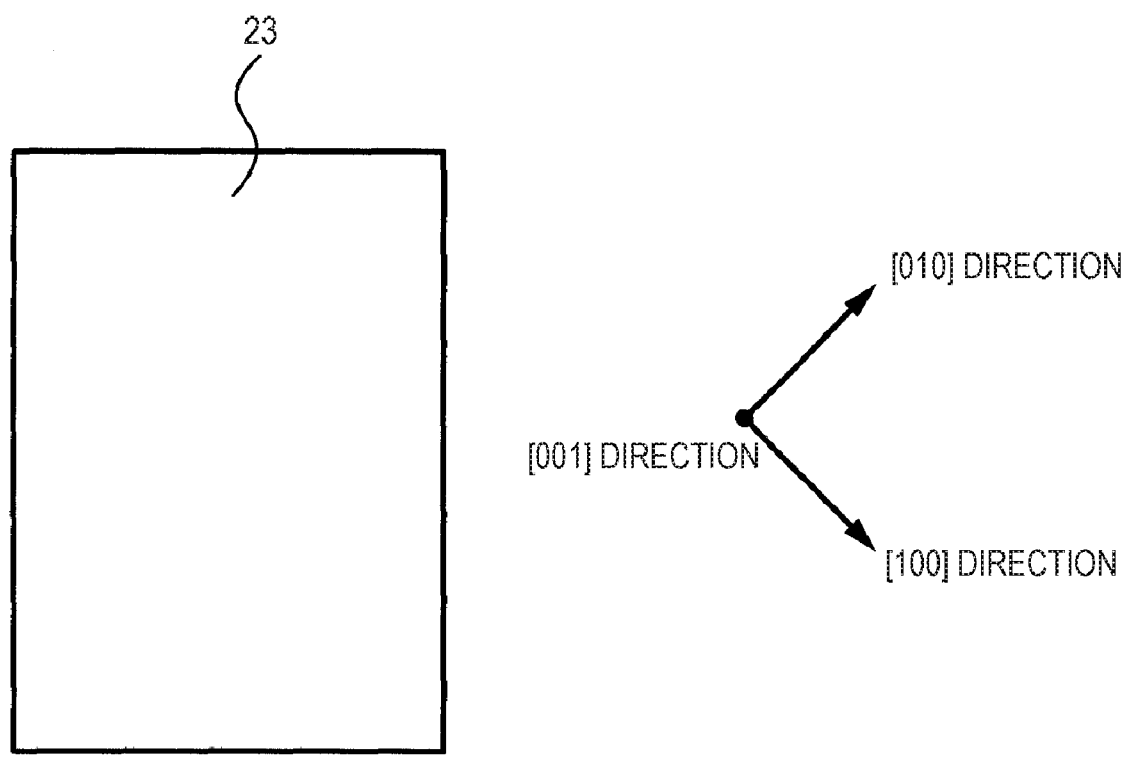
FIG. 12 is a plan view illustrating a resist pattern used as an etching mask in the light-emitting diode manufacturing method according to the second embodiment.

Next, as illustrated in FIG. 11B, a resist pattern 23 of a rectangular planar shape is formed on the semiconductor layer 22 by lithography. As illustrated in FIG. 12, the resist pattern 23 is formed in such a manner that the longer side extends in the [−110] or [1-10] direction of the semiconductor layer 22, and that the shorter side extends in the [110] or [−1-10] direction of the semiconductor layer 22. The shorter side of the resist pattern 23 is substantially equal in length to the top face of the semiconductor layer 22 after the etching. The longer side of the resist pattern 23 is longer than the top face of the semiconductor layer 22 after the etching.

Figure 11C:
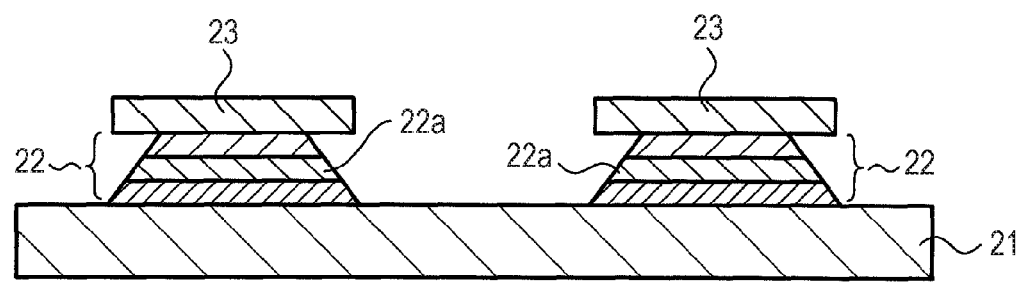

The semiconductor layer 22 is then patterned by wet etching using the resist pattern 23 as an etching mask. This results in element isolation, as illustrated in FIG. 11C. The wet etching etches the semiconductor layer 22 in a forward mesa configuration, providing a trapezoidal cross sectional shape for the semiconductor layer 22 on a plane parallel to the shorter side of the resist pattern 23. The both side faces of the semiconductor layer 22 are tilted on the (111) and (−1-11) planes, respectively. As in the first embodiment, because the off angle of the principal surface of the B-off substrate 21 is not reflected in the cross sectional shape of the semiconductor layer 22 in a direction parallel to the shorter side of the resist pattern 23, the cross sectional shape of the semiconductor layer 22 is bilaterally symmetrical, and the angles made by the both side faces with respect to the principal surface of the semiconductor layer 22 are equal to each other.

Next, after removing the resist pattern 23, an electrode (not illustrated), either a p-side electrode or an n-side electrode, is formed on the semiconductor layer 22.

Then, the B-off substrate 21 is bonded to a support substrate with an adhesive on the side of the semiconductor layer 22.

The B-off substrate 21 is then removed from the back face side by a method such as polishing or chemical etching to expose the semiconductor layer 22.

Then, an electrode of the opposite polarity (not illustrated), either a p-side electrode or an n-side electrode, is formed on the exposed surface of the semiconductor layer 22.

Thereafter, the support substrate and the adhesive are removed.

Figure 13:
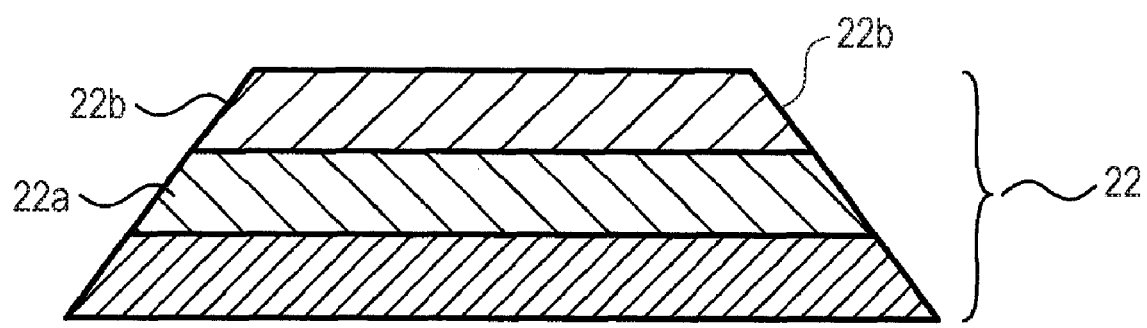
FIG. 13 is a cross sectional view illustrating a light-emitting diode according to the second embodiment.

As a result, as illustrated in FIG. 13, a light-emitting diode is formed that has a bilaterally symmetrical cross sectional shape, and in which the angles made by side faces 22b with respect to the principal surface of the semiconductor layer 22 are equal to each other. The principal surface on the upper base side of the semiconductor layer 22 in the light-emitting diode is tilted by a predetermined angle in the [−110] direction with respect to the (001) plane, and the side faces 22b of the semiconductor layer 22 lie on the (111) and (−111) planes, respectively. The light-emitting diode may be used as a sole element, or may be bonded, transferred, or wire connected to another substrate, depending on intended use.

The second embodiment offers the same or similar advantages as the first embodiment.

The present application has been specifically described with respect to certain embodiments and an example. However, the invention is not limited to the foregoing embodiments and example, and various modifications are possible based on the technical ideas of the invention.

For example, the variables such as numeric values, structures, configurations, shapes, and materials given in the foregoing embodiments and example are presented for illustrative purpose, and may be varied as needed.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A light-emitting diode comprising:
   a semiconductor layer formed of a compound semiconductor having a zincblende crystal structure and that forms a light-emitting diode structure, wherein the semiconductor layer has a trapezoidal cross sectional shape in one direction, an upper base-side principal surface tilted in a [110] direction with respect to a (001) plane, and two side faces that lie on (1-11) and (−111) planes, respectively.

2. The light-emitting diode according to claim 1, wherein the compound semiconductor forming the semiconductor layer is a III-V compound semiconductor or a II-VI compound semiconductor.

3. The light-emitting diode according to claim 2, wherein the compound semiconductor forming the semiconductor layer is an AlGaInP semiconductor, a GaAs semiconductor, or a ZnSe semiconductor.

4. The light-emitting diode according to claim 1, wherein the trapezoidal cross sectional shape is bilaterally symmetric.

5. A light-emitting diode comprising:
a semiconductor layer formed of a compound semiconductor having a zincblende crystal structure and that forms a light-emitting diode structure, wherein the semiconductor layer has a trapezoidal cross sectional shape in one direction, an upper base-side principal surface tilted in a [−110] direction with respect to a (001) plane, and two side faces that lie on (111) and (−1-11) planes, respectively.

6. The light-emitting diode according to claim 5, wherein the trapezoidal cross sectional shape is bilaterally symmetric.

* * * * *